(12) United States Patent
Wendel et al.

(10) Patent No.: US 6,559,503 B2
(45) Date of Patent: May 6, 2003

(54) TRANSISTOR WITH ESD PROTECTION

(75) Inventors: Martin Wendel, München (DE); Xaver Guggenmos, Dachau (DE); Wolfgang Stadler, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/001,179

(22) Filed: Nov. 2, 2001

(65) Prior Publication Data
US 2002/0093102 A1 Jul. 18, 2002

(30) Foreign Application Priority Data
Nov. 2, 2000 (DE) ........................ 100 54 184

(51) Int. Cl.⁷ .................... H01L 29/76; H01L 29/94; H01L 31/062; H01L 31/113; H01L 31/119
(52) U.S. Cl. .................... 257/333; 257/336; 257/355
(58) Field of Search .................. 257/900, 901, 257/902, 500, 501, 506, 333, 336, 355, 408, 344

(56) References Cited

U.S. PATENT DOCUMENTS

| | | | | |
|---|---|---|---|---|
| 5,523,249 A | * | 6/1996 | Gill et al. | 437/43 |
| 5,721,439 A | | 2/1998 | Lin | |
| 6,046,087 A | | 4/2000 | Lin et al. | |
| 6,153,909 A | * | 11/2000 | Jeon | 257/336 |

FOREIGN PATENT DOCUMENTS

JP 09107040 A * 4/1997

* cited by examiner

*Primary Examiner*—Wael Fahmy
*Assistant Examiner*—Dana Farahani
(74) *Attorney, Agent, or Firm*—Laurence A. Greenberg; Werner H. Stemer; Ralph E. Locher

(57) ABSTRACT

The transistor has source and drain diffusion regions between which a gate electrode is disposed. In order to increase the sheet resistance of the source and/or drain diffusion regions, a plurality of strip-shaped insulating zones are provided, which penetrate through the corresponding diffusion region. The zones are oriented perpendicularly to the gate electrode and the end a given spacing distance from the gate electrode.

18 Claims, 2 Drawing Sheets

TRANSISTOR WITH ESD PROTECTION

BACKGROUND OF THE INVENTION

Field of the Invention

The invention relates to a transistor which is protected against electrostatic discharges. The device has a substrate, doped source and drain diffusion regions formed in the substrate, a channel region which lies between the source and drain diffusion regions and extends in a direction along these regions, and a plurality of insulating, strip-type zones provided in the source and/or drain diffusion region in order to increase the electrical sheet resistance thereof.

Chips require protection against electrostatic discharges (ESD). Therefore, a multiplicity of ESD protection elements are situated in all chips. Furthermore, the active elements of the chips, in particular the driver transistors, have to be protected against ESD.

An essential measure for protecting transistors consists in positioning series resistors upstream of the drain and/or source electrodes of the transistors. The series resistors lead to a more homogeneous current flow during an ESD event and reduce the risk of failures as a result of current focusing. The resistors must neither be too small (this brings about an inhomogeneous current flow, which results in inadequate ESD strength) nor too large (this brings about an excessively high voltage drop in the event of large currents and hence no longer a protective effect).

A customary measure for implementing such series resistors consists in providing a sufficiently long diffusion region between the corresponding contact holes (drain contact hole and source contact hole, respectively) and the gate electrode of the MOS transistor. The diffusion region length which is necessary for the series resistor required results from the sheet resistance of the diffusion region and the desired value for the series resistor. What is disadvantageous about this procedure is that—also on account of the siliciding of the connection structures which is carried out as standard in semiconductor technology—comparatively long diffusion regions are required, resulting in a high area occupancy.

An alternative procedure for increasing the series resistance of the source and/or drain electrodes consists in the siliciding of the connection structures which is provided as standard being prevented, at least in regions, in the region of the diffusion region by means of a masking step (so-called "silicide blocking mask"). That technique is described in U.S. Pat. No. 6,046,087. The omission—in regions—of the silicide layer having a high electrical conductivity above the diffusion region makes it possible to reduce the length of the diffusion region without impairing the ESD strength of the component.

U.S. Pat. No. 5,721,439, which represents the closest prior art of which we are aware, describes a MOS transistor (MOS: Metal Oxide Semiconductor) wherein strip-type islands of reduced electrical sheet resistance are produced in the silicided drain and source diffusion regions. The islands bring about an increase in the diffusion resistances in the regions of the current feeders for the drain and source electrodes. The individual islands are oriented perpendicularly to the direction of current flow (i.e. parallel to the gate) and are arranged offset with respect to one another. They form current barriers by means of which the current is distributed over the entire available area of the diffusion regions. What is disadvantageous, however, is that, on account of the winding current path, current constrictions or inhomogeneities can occur which adversely affect the ESD strength.

SUMMARY OF THE INVENTION

It is accordingly an object of the invention to provide a transistor with ESD protection, which overcomes the above-mentioned disadvantages of the heretofore-known devices and methods of this general type and which provides for a transistor that exhibits a high ESD strength in conjunction with short diffusion distances. It is a particular object of the invention that the driver capability of the transistor should not be impaired by the ESD protection measures.

With the foregoing and other objects in view there is provided, in accordance with the invention, a transistor, comprising:

a substrate;

doped source and drain diffusion regions formed in the substrate;

a channel region disposed between the source and drain diffusion regions and extending in a first direction along the source and drain diffusion regions;

a plurality of strip-shaped insulating zones in at least one of the source and drain diffusion regions for increasing an electrical sheet resistance thereof;

the strip-shaped insulating zones extending along a second direction oriented substantially perpendicular to the first direction of the channel region; and the strip-shaped insulating zones having ends facing the channel region and spaced apart from the channel region.

In other words, the basic concept of the invention consists in strip-type, insulating zones being oriented essentially perpendicularly to the profile of the channel region of the transistor. The result of this is that the direction of current flow corresponds to the longitudinal direction of the insulating zones. As a result, an essentially homogeneous current transport is maintained over the entire diffusion region. This increases the ESD protective effect since current constrictions or focusing are avoided in the region of the diffusion region. At the same time, the desired effect of increasing the diffusion resistance is achieved through the reduction of the effective area available for current conduction.

The term "insulating zones" as used herein also encompasses zones of reduced electrical conductivity. A complete and absolute insulation effect is not necessary.

The spacing left between the channel region and those ends of the insulating zones which face the channel region has the effect that the current passed between the insulation ribs can be distributed again directly upstream of the channel region (or upstream of the gate electrode in the case of a MOS transistor). The advantage of this measure is that the driver capability of the transistor is not impaired by the insulating zones, since the entire width of the channel region remains usable.

In accordance with a preferred embodiment of the invention, the transistor is a MOS transistor having a gate electrode assigned to the channel region or a lateral bipolar transistor.

An advantageous embodiment of the transistor according to the invention is wherein the distances between those ends of the insulating zones which face the channel region and the channel region are between 0.02 and 1.0 $\mu$m. With such dimensioning, the two aspects of a high driver capability and a good ESD protection effect are taken equally into account.

For reasons of obtaining a high current homogeneity, the strip-type, insulating zones are preferably arranged essentially parallel and at approximately the same transverse distance with respect to one another. That is, in accordance with an added feature of the invention, the strip-shaped insulating zones are arranged substantially parallel to and substantially equidistant from one another along the first direction.

Since the strip-type, insulating zones are oriented in the direction parallel to the direction of current flow, the zones can readily have a continuous profile, i.e. perforations in the zones are not necessary.

Preferably, a sheet resistance of the drain and/or source diffusion region which lies between 50 and 300 Ω/□, in particular 80 and 150 Ω/□, is set by means of a suitable dimensioning of the insulating, strip-type zones. A sheet resistance of this magnitude is optimal for enabling short diffusion distances in conjunction with good ESD protection.

Other features which are considered as characteristic for the invention are set forth in the appended claims.

Although the invention is illustrated and described herein as embodied in a transistor with ESD protection, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
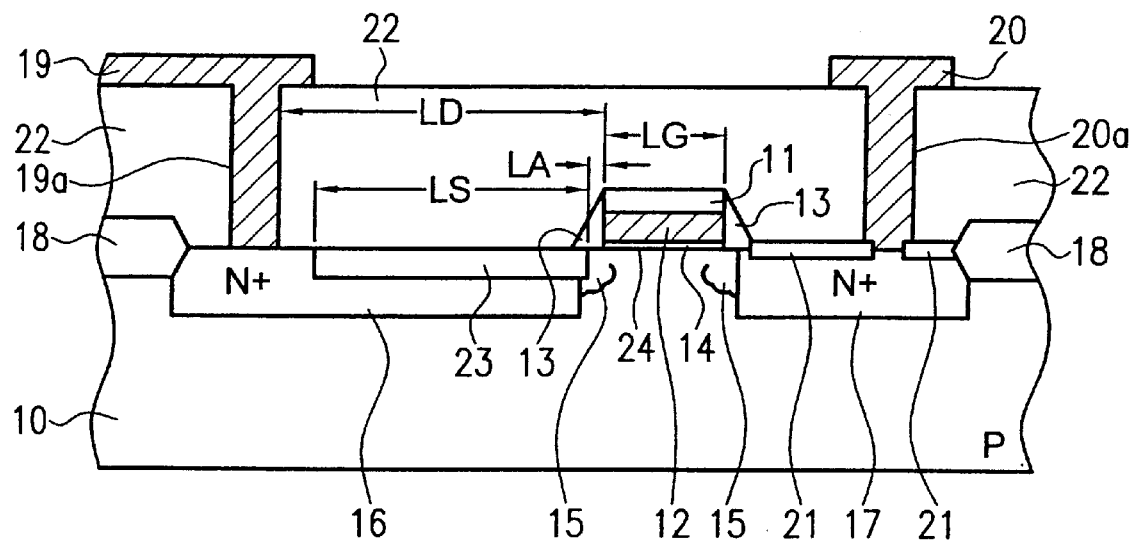
FIG. 1 is a diagrammatic sectional illustration of a MOS transistor with a drain diffusion region that is protected against ESD in accordance with the invention.

Referring now to the figures of the drawing in detail and first, particularly, to FIG. 1 thereof, there is shown an NMOS transistor constructed on a p-doped substrate 10. A drain diffusion region 16 and a source diffusion region 17 are formed in the substrate 10 by means of an n$^+$-type doping. A gate structure is arranged between the two diffusion regions 16, 17. The gate structure, in the illustrated exemplary embodiment, is constructed from a gate electrode 12 composed of polysilicon, an insulation layer 11 (e.g. made of silicon dioxide) arranged above the latter, and lateral spacers 13, which are likewise composed of an insulating material. The gate electrode 12 is isolated from the underlying substrate 10 by means of a thin gate insulation layer 14 and is thus electrically insulated from the substrate. Adjoining the gate insulation layer 14 and also the two highly doped diffusion regions 16, 17, respective weakly n-doped regions 15 (LDD) may be provided in the substrate 10. The channel region 24 of the MOS transistor extends between the two weakly doped regions 15 beneath the gate insulation layer 14. It has essentially the same lateral dimensions as the gate electrode 12.

In order to make contact with the MOS transistor, metallization layers 19 and 20 are present, which pass through contact holes 19a and 20a, respectively, in an oxide covering layer 22 deposited above the substrate 10. The metallizations 19 and 20 make electrical contact with the drain and source diffusion regions 16, 17, respectively.

In order to increase the electrical conductivity the source diffusion region 17 may be silicided on its top side. Silicided layer regions are identified by the reference symbol 21.

In the region of the drain diffusion region 16, the latter is not silicided. Instead, an ESD protection structure is arranged between the metallization layer 19 and the gate structure.

The ESD protection structure may be formed in the form of a set of insulation ribs 23 running parallel, one of which can be seen in longitudinal section in FIG. 1. The insulation ribs 23 may be realized for example in the form of trenches (trench depth for example about 200 nm) which are introduced into the surface of the substrate 10 in the drain diffusion region 16 and filled with an insulating material, for example silicon oxide or silicon nitride.

If the drain diffusion region 16 is silicided as well, the insulation ribs 23 penetrate through the silicide layer situated there.

A length of the insulation ribs 23 is designated by LS in FIG. 1. LG designates the gate length. It becomes clear that the insulation ribs 23 of the ESD protection structure do not reach right up to the contour of the gate electrode 12 (corresponds to the edge of the channel region 24) but rather are spaced apart from it. The distance between the insulation ribs 23 and the gate electrode 12 is designated by LA. The diffusion length LD corresponds to the distance between the metallization layer 19 and the gate electrode 12 (or the channel region 24).

Figure 2:
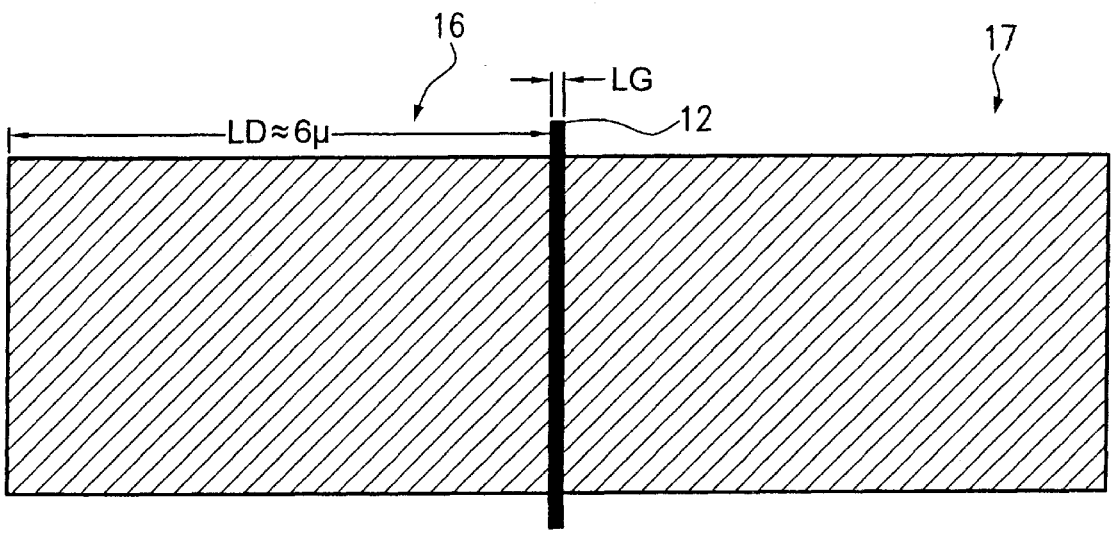
FIG. 2 is a diagrammatic plan view of drain and source diffusion regions with a gate electrode arranged in between, in accordance with the prior art.

Referring now to FIG. 2, there is shown, in plan view, the position and shaping of the drain diffusion region 16, of the source diffusion region 17 and also of the gate electrode 12 in accordance with the prior art. The weakly doped regions 15 are included with the diffusion region, i.e. the gate electrode 12, in perpendicular projection, directly adjoins the two diffusion regions 16 and 17 or slightly overlaps them.

In order to obtain sufficient protection against ESD in the case of a non-silicided drain diffusion region 16, a diffusion length LD of about 6 μm is required in the case of the conventional construction. Shorter diffusion lengths LD result in an excessively low electrical resistance of the diffusion region 16 and hence inadequate ESD strength of the component.

Figure 3:
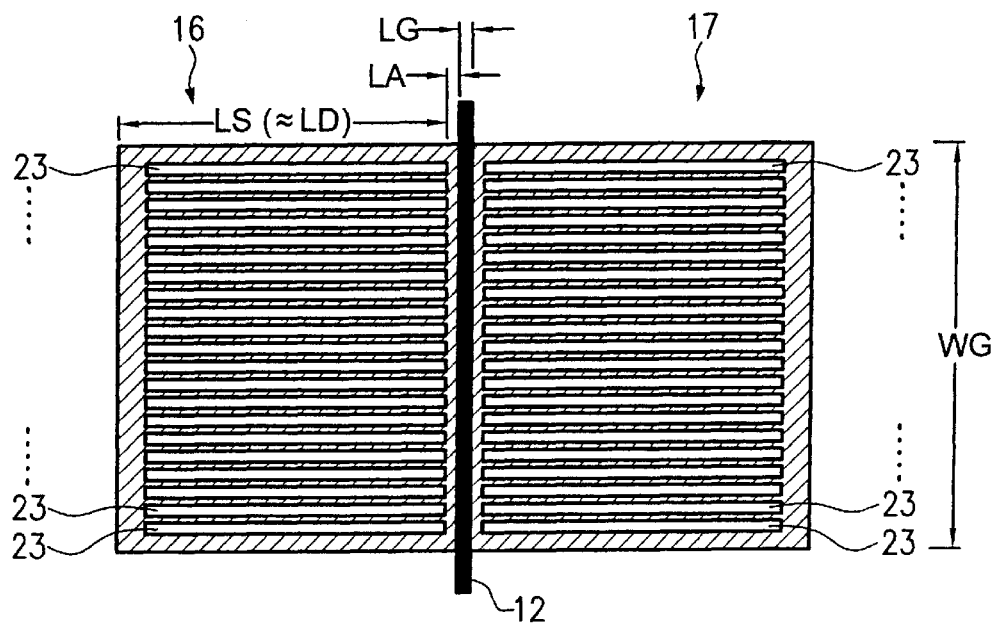
FIG. 3 is a diagrammatic plan view of drain and source diffusion regions with a gate electrode arranged in between, in accordance with the invention.

FIG. 3 shows the position and shaping of two ESD protection structures according to the invention, in plan view. In contrast to FIG. 1, the ESD protection structures are in this case provided in the region both of the drain diffusion region 16 and of the source diffusion region 17.

Each ESD protection structure comprises a set of insulation ribs 23 running parallel, which, as already mentioned, may be realized e.g. in the form of slots or trenches filled with an insulation material. What is important is that a significant local reduction of the electrical conductivity is achieved in the region of an insulation rib 23.

Figure 4:
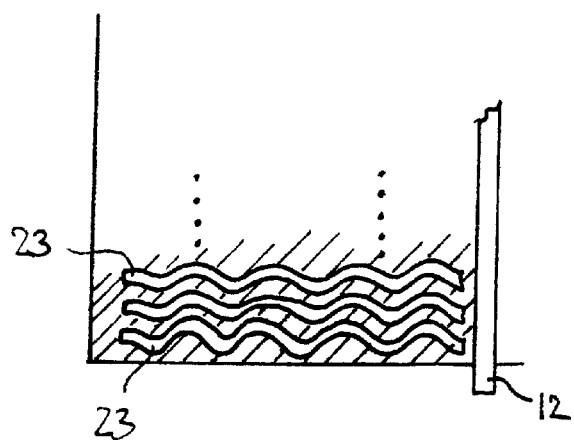
FIG. 4 is a similar partial view illustrating an alternative implementation of the insulating ribs.

The insulation ribs 23 run parallel to the current flow direction. They may be embodied both in a straight line, as illustrated in FIG. 3, and/or in the form of an undulating or meandering line, as illustrated in FIG. 4. In order to ensure a high current homogeneity, they are preferably arranged parallel and at an identical transverse distance with respect to one another. They channel the current flowing toward/away from the gate electrode 12. The gate electrode 12 extends in a direction perpendicular to the insulation ribs 23.

Since the insulation ribs 23 do not quite reach the gate electrode 12, but rather end-at a distance LA from the gate electrode 12, the current is given the opportunity to be distributed there. In other words, the gate width of the transistor is not significantly affected by the ESD protection structure. This means, moreover, that high currents can be passed through the MOS transistor. LA may be between 0.02 and 1.0 μm.

By virtue of the invention, the drain and/or source series resistance can be set within wide ranges to the optimum value for ESD protection, independently of a predetermined dimensioning of the diffusion region. By way of example, it is possible to obtain an increase in the average sheet resistance from 50 Ω/□ (per square) to 80–150 Ω/□, typically about 100 Ω/□. This makes it possible for the diffusion length LD of the drain and source diffusion regions 16, 17, respectively, to be shortened approximately by the factor 2. In the case of the invention, LD is typically about 3 μm.

In FIG. 3, the insulation ribs 23 cover practically the entire diffusion region 16 or 17, respectively, with the exception of edge regions, i.e. the ESD protection structure extends as far as the associated metallization layers 19, 20. In this case, LS≈LD holds true.

In the case of a MOS transistor arrangement according to the prior art without an ESD protection structure, an ESD strength of 2.2 kV was achieved given a gate width WG of 200 μm, an ESD strength of 3.6 kV was achieved given a gate width WG of 400 μm and an ESD strength of 4.6 kv was achieved given a gate width WG of 800 μm. The corresponding values with regard to comparable transistor arrangements with an ESD protection structure were 3.6 kV (WG=200 μm), 7.0 kv (WG=400 μm) and >8 kV (WG=800 μm). Consequently, for the same area, the ESD strength of the diffusion regions 16, 17 was able to be approximately doubled, or, for the same ESD strength, the area of the diffusion regions 16, 17 was able to be approximately halved.

The invention can likewise be-applied to lateral bipolar transistors, which, in contrast to MOS transistors, do not have a gate electrode. Other transistor types (FOX, BICMOS) are likewise conceivable.

An important practical advantage of the invention is that it enables the ESD strength of products of a fabrication line to be maintained even when changes are made to technological parameters in the fabrication line. This is the case in particular when a fabrication process is transferred from one factory to another. In this case, the problem arises that the processing in the new factory always has to be carried out with altered technological parameters (doping densities, implantation parameters etc.) on account of different apparatus equipment and other reasons.

On the other hand, mask changes should be avoided if possible, owing to the high costs associated with them. The machines in the new process line are then set such that key parameters such as saturation current and threshold voltage of the MOS transistors remain within the tolerances. In the case of other parameters, such as the sheet resistance for example, it may be necessary to accept considerable alterations. This adversely affects the ESD strength of the semiconductor chips produced, because the series resistances are now no longer set optimally.

By way of example, if processing in the new factory has to be effected with a lower sheet resistance, the result of this is that the series resistance brought about by the dimensions of the diffusion regions 16, 17 no longer suffices to ensure effective ESD protection. In the worst-case scenario, this previously had the effect that the entire mask layout (i.e. the entire set of masks) had to be redesigned because greater diffusion distances were required. By contrast, the invention makes it possible to compensate for the resistance changes by the redesign of a single mask—namely that mask which is used to pattern the rib structure shown in FIG. 3. In the example mentioned (reduction of the sheet resistance in the diffusion region), this is done by the number and/or width and/or length of the insulation ribs 23 being increased in a targeted manner (while retaining all the mask dimensions).

We claim:

1. A transistor, comprising:

a substrate;

doped source and drain diffusion regions formed in said substrate;

a channel region disposed between said source and drain diffusion regions and extending in a first direction along said source and drain diffusion regions;

a plurality of strip-shaped insulating zones in at least one of said source and drain diffusion regions for increasing an electrical sheet resistance thereof;

said strip-shaped insulating zones extending along a second direction oriented substantially perpendicular to the first direction of said channel region; and said strip-shaped insulating zones having ends facing said channel region and spaced apart from said channel region.

2. The transistor according to claim 1 formed as a MOS transistor having a gate electrode assigned to said channel region.

3. The transistor according to claim 1 formed as a lateral bipolar transistor.

4. The transistor according to claim 1, wherein said strip-shaped insulating zones are arranged substantially parallel to and substantially equidistant from one another along the first direction.

5. The transistor according to claim 1, wherein said ends of said insulating zones facing said channel region are spaced from said channel region by a spacing distance of between 0.02 and 1.0 μm.

6. The transistor according to claim 1, wherein said strip-shaped insulating zones have a continuous profile.

7. The transistor according to claim 1, wherein said strip-shaped insulating zones together form a pattern substantially completely covering said diffusion region, except a spacing region adjacent said channel region.

8. The transistor according to claim 1, wherein said strip-shaped insulating zones together form a pattern substantially completely covering said diffusion region, except a spacing region adjacent said channel region and narrow edge regions.

9. The transistor according to claim 1, wherein said strip-type zones run along substantially straight lines.

10. The transistor according to claim 1, wherein said strip-type zones run along undulating lines.

11. The transistor according to claim 1, wherein a length of said strip-shaped insulating zones is between 2 and 4 μm.

12. The transistor according to claim 1, wherein a length of said strip-shaped insulating zones is approximately 3 µm.

13. The transistor according to claim 1, wherein said strip-shaped insulating zones are formed by an insulation material deposited in trenches in said diffusion region.

14. The transistor according to claim 13, wherein said insulation material is silicon dioxide.

15. The transistor according to claim 1, wherein said strip-shaped insulating zones are dimensioned to set a sheet resistance of said diffusion region to between 50 and 300 Ω/□.

16. The transistor according to claim 1, wherein said strip-shaped insulating zones are dimensioned to set a sheet resistance of said diffusion region to between 80 and 150 Ω/□.

17. The transistor according to claim 1, wherein no short-circuit layer is arranged above said diffusion region.

18. The transistor according to claim 1, wherein no silicide layer is arranged above said diffusion region.

* * * * *